United States Patent [19]
Wallace et al.

[11] Patent Number: 6,137,377
[45] Date of Patent: Oct. 24, 2000

[54] FOUR STAGE SELECTABLE PHASE SHIFTER WITH EACH STAGE FLOATED TO A COMMON VOLTAGE

[75] Inventors: Jack E. Wallace, Redmond; Harold J. Redd, Seattle; Robert J. Furlow, Kirkland, all of Wash.; John Haworth, Livingston, Tex.

[73] Assignee: The Boeing Company, Seattle, Wash.

[21] Appl. No.: 09/435,130

[22] Filed: Nov. 5, 1999

Related U.S. Application Data

[62] Division of application No. 09/013,763, Jan. 27, 1998, Pat. No. 6,020,848.

[51] Int. Cl.[7] .................................................. H03H 7/32
[52] U.S. Cl. .................................................. 333/139; 327/252
[58] Field of Search ........................... 333/138, 139; 327/237, 252

[56] References Cited

U.S. PATENT DOCUMENTS

| | | | |
|---|---|---|---|
| 4,599,585 | 7/1986 | Vorhaus et al. | 333/139 X |
| 4,638,190 | 1/1987 | Hwang et al. | 327/237 |
| 4,737,793 | 4/1988 | Munson et al. | 342/361 |
| 4,742,354 | 5/1988 | Wen et al. | 342/188 |
| 4,751,453 | 6/1988 | Foti | 323/212 |
| 4,939,527 | 7/1990 | Lamberty et al. | 343/771 |
| 4,977,382 | 12/1990 | Podell et al. | 333/164 |
| 4,994,761 | 2/1991 | Craft | 330/302 |
| 5,125,109 | 6/1992 | Geller et al. | 455/313 |
| 5,146,190 | 9/1992 | Firmain | 333/117 |
| 5,148,062 | 9/1992 | Goldfarb | 333/139 X |
| 5,201,065 | 4/1993 | Niehenke | 455/83 |
| 5,247,269 | 9/1993 | Boulouard et al. | 333/126 |
| 5,270,719 | 12/1993 | Roth | 342/157 |
| 5,283,587 | 2/1994 | Hirshfield et al. | 342/372 |
| 5,304,999 | 4/1994 | Roberts et al. | 343/778 |
| 5,376,942 | 12/1994 | Shiga | 343/700 MS |
| 5,400,042 | 3/1995 | Tulintseff | 343/727 |
| 5,414,433 | 5/1995 | Chang | 342/375 |
| 5,488,380 | 1/1996 | Harvey et al. | 342/368 |
| 5,493,305 | 2/1996 | Wooldridge et al. | 342/368 |
| 5,504,465 | 4/1996 | Yung et al. | 332/145 |
| 5,504,493 | 4/1996 | Hirshfield | 342/372 |
| 5,532,706 | 7/1996 | Reinhardt et al. | 343/778 |
| 5,568,158 | 10/1996 | Gould | 343/756 |

OTHER PUBLICATIONS

R. Carandang et al., "A K–Band Hemt Low Noise Receiver MMIC For Phased Array Applications," *IEEE MTT–S Digest*, pp. 521–523 (1991).

M. J. Schindler et al., "A 3 Bit K/Ka Band MMIC Phase Shifter," *IEEE 1988 Microwave and Millimeter–Wave Monolithic Circuits Symposium*, pp. 95–98 (1988).

Y. Ayasli et al. "Wide–Band Monolithic Phase Shifter," *IEEE Transactions on Microwave Theory and Techniques*, MTT–32, No. 12, pp. 1710–1714 (1984).

Y. Ayasli et al., "Wideband S–C Band Monolithic Phase Shifter," *IEEE*, pp. 11–14 (1984).

C. Moye et al., "A Compact Broadband, Six–Bit MMIC Phasor With Integrated Digital Drivers+," *IEEE 1990 Microwave and Millimeter–Wave Monolithic Circuit Symposium*, pp. 123–126 (1990).

K.M. Simon et al., "A production Ready, 6–18 Ghz Five–Bit Phase Shifter with Integrated CMOS Compatible Digital Interface Circuitry," *IEEE GaAs IC Symposium*, pp. 251–254 (1991).

*Primary Examiner*—Justin P. Bettendorf
*Attorney, Agent, or Firm*—John C. Hammar

[57] ABSTRACT

The present invention provides a new architecture for MMIC circuitry that allows reception of electronically selectable single polarity or simultaneous dual polarity/dual beam signals by placed-array modules. Additionally, an improved phase shifter design that is smaller said requiring fewer electronic components than prior art phase shifters is disclosed. In particular, the phase shifter requires only a single control line for each stage of the phase shifter.

4 Claims, 10 Drawing Sheets

FOUR STAGE SELECTABLE PHASE SHIFTER WITH EACH STAGE FLOATED TO A COMMON VOLTAGE

REFERENCE TO RELATED APPLICATIONS

The present invention is a divisional application based upon U.S. Provisional application Ser. No. 09/013,763, filed Jan. 27, 1998 now U.S. Pat. No. 6,020,848.

FIELD OF THE INVENTION

The present invention is related to dual polarization phased-array antennas and, more particularly, to the monolithic microwave integrated circuit (MMIC) amplifiers, phase shifters, switches and polarization networks necessary to implement such antennas for use in switchable or simultaneous dual polarity/dual beam high-frequency communication systems.

BACKGROUND OF THE INVENTION

A typical conventional phased-array antenna has an arrangement of radiating and/or receiving elements where the relative phase of radio frequency (RF) waves propagated/received through the elements can be controlled to steer the "beam" of the antenna's radiation pattern. In one type of phased-array antenna, known as an active array, each radiating/receiving element has associated electronics that includes at least an amplifier and a variable phase shifter. The distributed nature of the active array architecture offers advantages in, for example, power management, reliability, system performance and signal reception and/or transmission.

One example of a single polarity active array is disclosed in U.S. Pat. No. 5,276,455 (hereinafter "the '455 patent") issued to Fitzsimmons,et al., Jan. 4, 1994, assigned to the same assignee as the present invention and incorporated herein by reference in its entirety. FIG. 7 of the '455 patent, reproduced herein as FIG. 1, is an exploded view of an active array antenna 100 disclosed in the '455 patent for use in receiving or transmitting circularly polarized RF signals. The circularly polarized RF signal may either be fixed left-hand polarized or right-hand polarized.

Antenna 100 has an antenna honeycomb 132, a module honeycomb 128 and a feed honeycomb 134, each having a plurality of waveguides aligned with a corresponding waveguide in the other honeycombs. Each waveguide of honeycomb 132 contains a dielectric 146 and separate polarizer 148. Each waveguide of honeycomb 128 contains an "in-line" active array module 130 (i.e., the substrate of each module 130 is parallel or "in-line" with the direction of the received or transmitted RF signal propagation), and each waveguide of honeycomb 134 contains a dielectric 146.

Further, antenna 100 has a waveguide feed network 112 for propagating RF signals to or from feed honeycomb 134, and multilayer wiring boards 140a and 140b for distributing power and logic signals to modules 130. Multilayer wiring boards 140a and 140b do not propagate the RF signals transmitted or received by antenna 100. Rather, modules 130 perform waveguide-to-waveguide transmission of the received and transmitted RF signals via antenna honeycomb 132 and feed honeycomb 134.

In addition, modules 130 have extension substrates for input and output couplers for inputting and outputting RF signals to or from antenna honeycomb 132 and feed honeycomb 134, as well as a carrier substrate for supporting and interconnecting MMICs for amplifying and phase shifting the received or transmitted RF signals. FIG. 1A shows a cutaway view of the modules 130 showing the embedding of the MMIC phase shifter 180a and the MMIC power amplifier 180b. This type of array can support transmission or reception of a single polarity signal. The polarity of the signal is determined by the physical orientation of the dielectric slab polarizer 146 in the honeycomb 132. The electronic phase shifter in each module allows the beam pattern to be electrically positioned.

As the frequency of the RF signal increases, the element spacing, and thus the size of the phased-array antenna must decrease, in order to not generate grating lobes, at the high scan angles that are required for airborne applications. Accordingly, the size of each receiving element of the phased-array antenna decreases. For many applications, the RF signal has a frequency of well over 10 GHz. As the size of the receiving elements decrease, the space available for the MMICs also decreases. Therefore, it is important to design an MMIC amplifier and phase shifter that will provide the necessary performance while occupying as little space as possible. The length of the electronic module 130 can be increased somewhat, if necessary, to accommodate larger MMIC components. However, this is not desirable since it will cause the array thickness to increase. It is desirable that the antenna be as thin as possible to reduce aerodynamic drag. Further, cutting the aircraft skin so that the antenna may be recessed is impractical because cuts reduce the structural integrity of the aircraft.

Compared to other existing active single polarity phased array antennas, the '455 patent antenna offers improvements in size, thickness, cost, maintainability, reliability, testability, and assembly. But this antenna is still relatively thick for airborne applications and, because of its complexity, is relatively costly.

An example of a lower-cost thinner phased-array antenna that contains an integrated polarizer with a polarity select switching network, is disclosed in co-pending and commonly owned U.S. patent application Ser. No. 08/576,020 by Fitzsimmons, et al., entitled "LOW-COST COMMUNICATION PHASED-ARRAY ANTENNA." The planar configuration of the electronic modules in this antenna allows the antenna to be thinner than other antennas which use in-line modules. This antenna is thin enough to be externally mounted on a commercial aircraft. In addition, it allows each EM signal probe to be connected to its corresponding amplifier without the use of striplines, finlines or slotlines that are used in some conventional phased-array antennas, thereby reducing the complexity of the metallization of the substrate and further reducing signal loss. Furthermore, this planar antenna allows the use of two orthogonal antenna probes, which are required to build an electronically selectable single polarity or dual polarity phased array antenna.

This antenna is shown in FIGS. 2, 2A, 2B, 2C, and 3. This antenna uses planar semiconductor modules 408 that contain orthogonal waveguide probes 502 & 504 that couple the EM signals from the waveguides 406 into the module's low noise amplifiers (LNAs) 508 & 510 inputs. The polarity select network 514 forms a combined RF signal that is electronically selectable between left hand or right hand circularly polarized. Each electronic module then amplifies 520 and phase shifts 524 the circularly polarized signal. This signal is then connected to the stripline combiner networks on the multilayer wiring board 416 which combines the module outputs at the subarray level. The DC power supply filtering and amplifier biasing for each module must be accomplished by the electronics in each module, since this low-cost packaging concept does not allow space on the multilayer wiring board for external components to filter the DC power, to each element. Compared with the '455 patent and other prior art phased array antennas, this antenna is much lower cost, thinner and can provide an electronically switchable dual polarity output.

By using the MMIC electronics circuitry disclosed in FIG. 4 and modifying the packaging concept disclosed in FIG. 2 to include, among other modifications, additional stripline combiner networks in the multilayer wiring board and the associated necessary connections, a dual polarity dual beam phased-array antenna can be constructed. The modules for each element of this antenna contains two MMIC phase shifters, one for each of its two outputs, thereby allowing this antenna to be steered to track two different beams simultaneously.

Another effect of high frequency RF signals is that the MMICs generally cannot be implemented using conventional silicon based technologies. Instead, the MMIC must be implemented using GaAs technology, which is generally capable of operating at very high frequencies. One disadvantage of GaAs components is their high cost. GaAs integrated circuits are typically several times as expensive as conventional silicon integrated circuits. Because of the large number of MMICs in each phased-array antenna, the cost of GaAs can be prohibitive. One approach to mitigating the cost of GaAs MMICs is to shrink the size of the MMICs. The smaller the size of the GaAs MMICs, the less the cost. Also the planar electronics module size is limited by the array element spacing which constrains the area available for MMIC circuitry. Thus, it is doubly important to design MMIC amplifier, phase shifter, switches, phase shift networks, switches and combiner networks that are compact. Another factor that affects MMIC cost is the yield of the circuits to the electrical performance requirements. What is needed is phased array circuit elements and circuit architectures that are small in size, easy to implement and give a high electrical performance yield in GaAs technology. The MMICs in this invention address all of these concerns.

SUMMARY OF THE INVENTION

The present invention provides integrated MMIC chipsets which contain all of the circuitry necessary for fabrication of each antenna element. The present invention also provides integrated MMIC chipsets which contain all of the circuitry necessary for the fabrication of each element of a simultaneous dual polarity output phased array antenna. A novel architecture for switchable and simultaneous dual polarization integrated amplifier polarizer MMICs is disclosed. A design for a process insensitive, compact, self-biased low noise amplifier (LNA) is disclosed Also disclosed is an improved digital, phase shifter design that is smaller and requires fewer electronic components than prior art phase shifters. In particular, the phase shifter requires only a single control line for each stage of the phase shifter, thereby eliminating the requirement for on or off chip differential switch drivers to drive the switches contained in the phase shifter.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
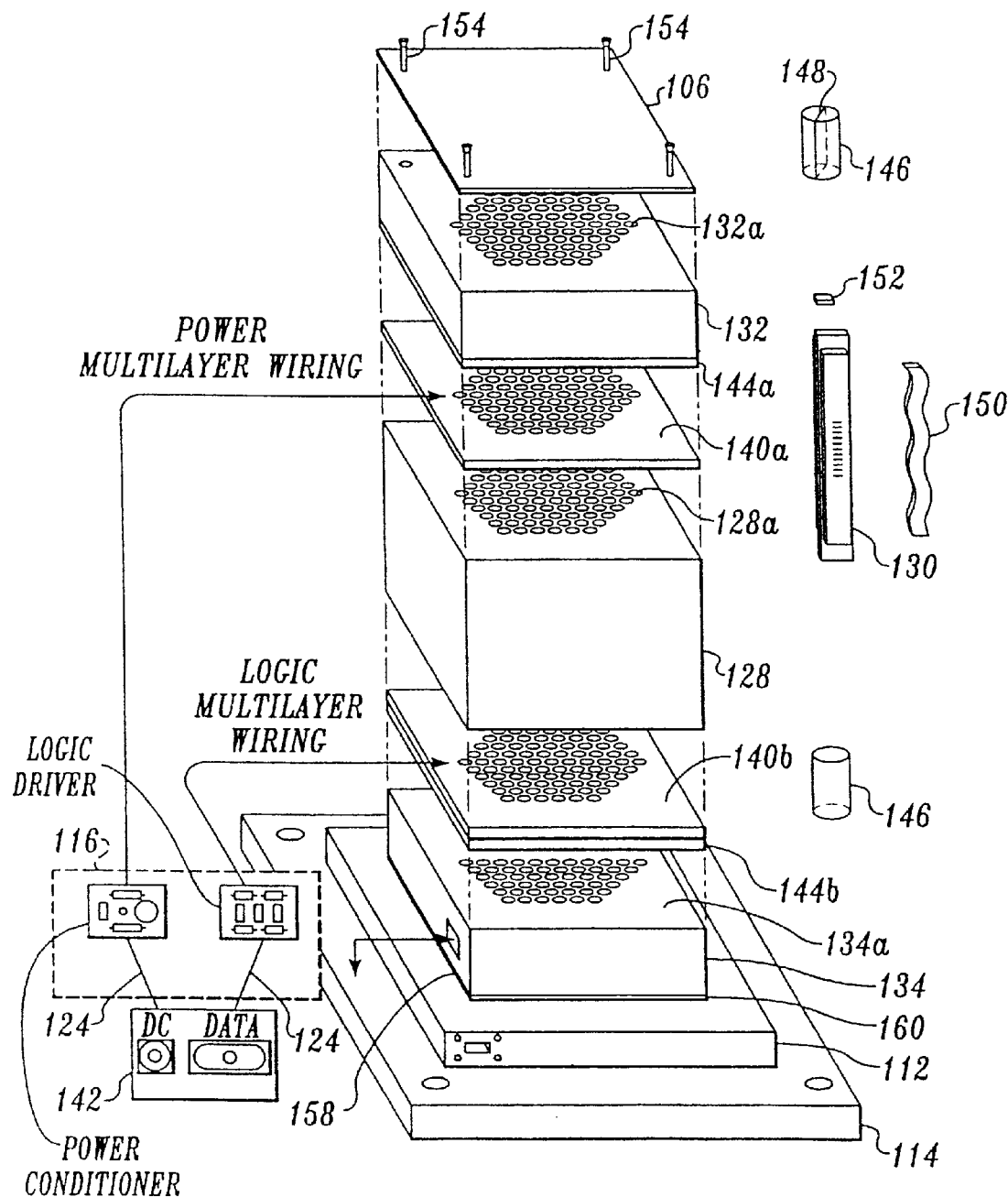
FIG. 1 is an exploded top perspective of a prior art "in-line" phased array antenna.
Figure 1A:
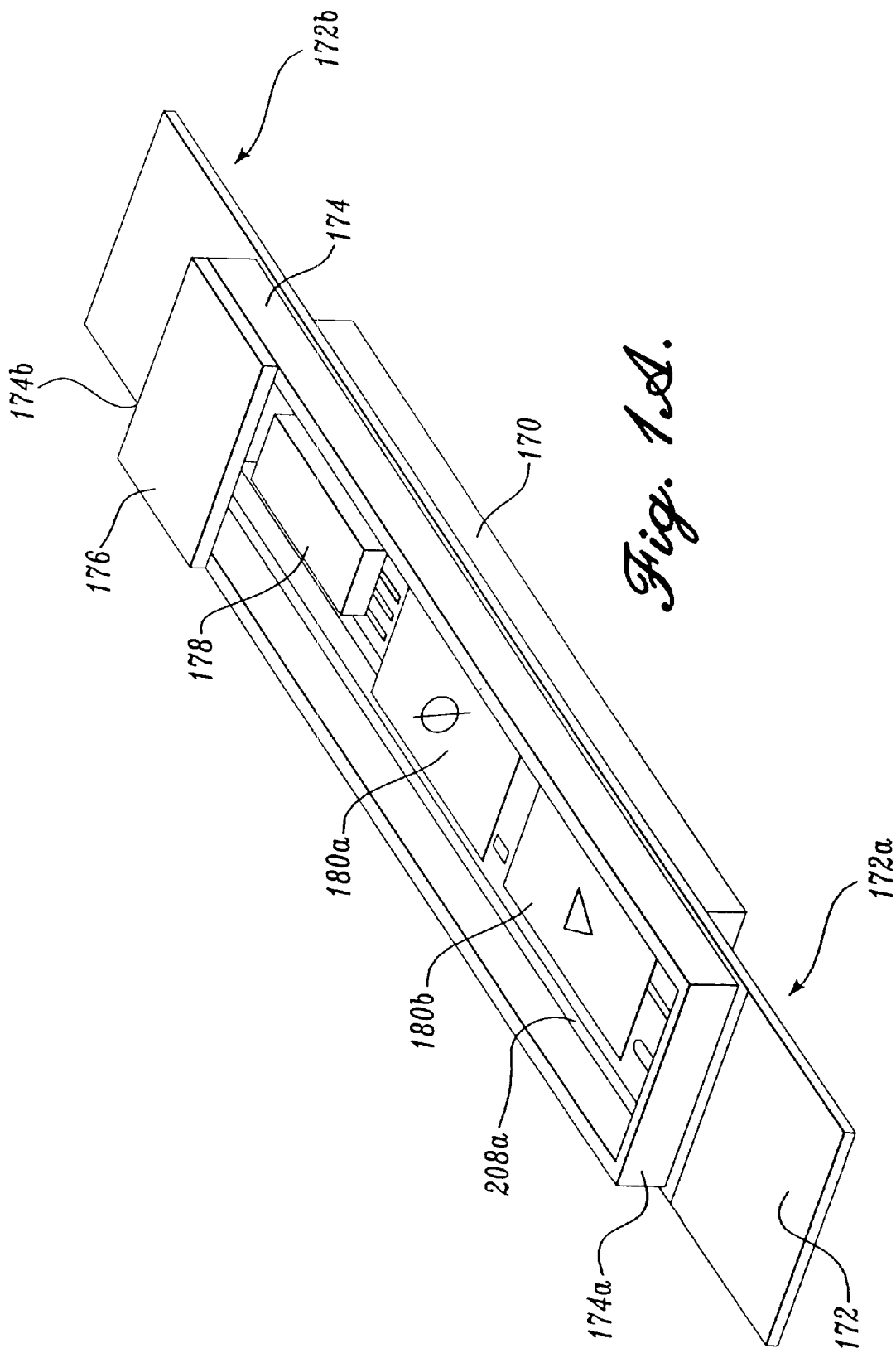
FIG. 1A is cutaway of the electronics module of a prior art "in-line" fixed polarity phased-array antenna.
Figure 2:
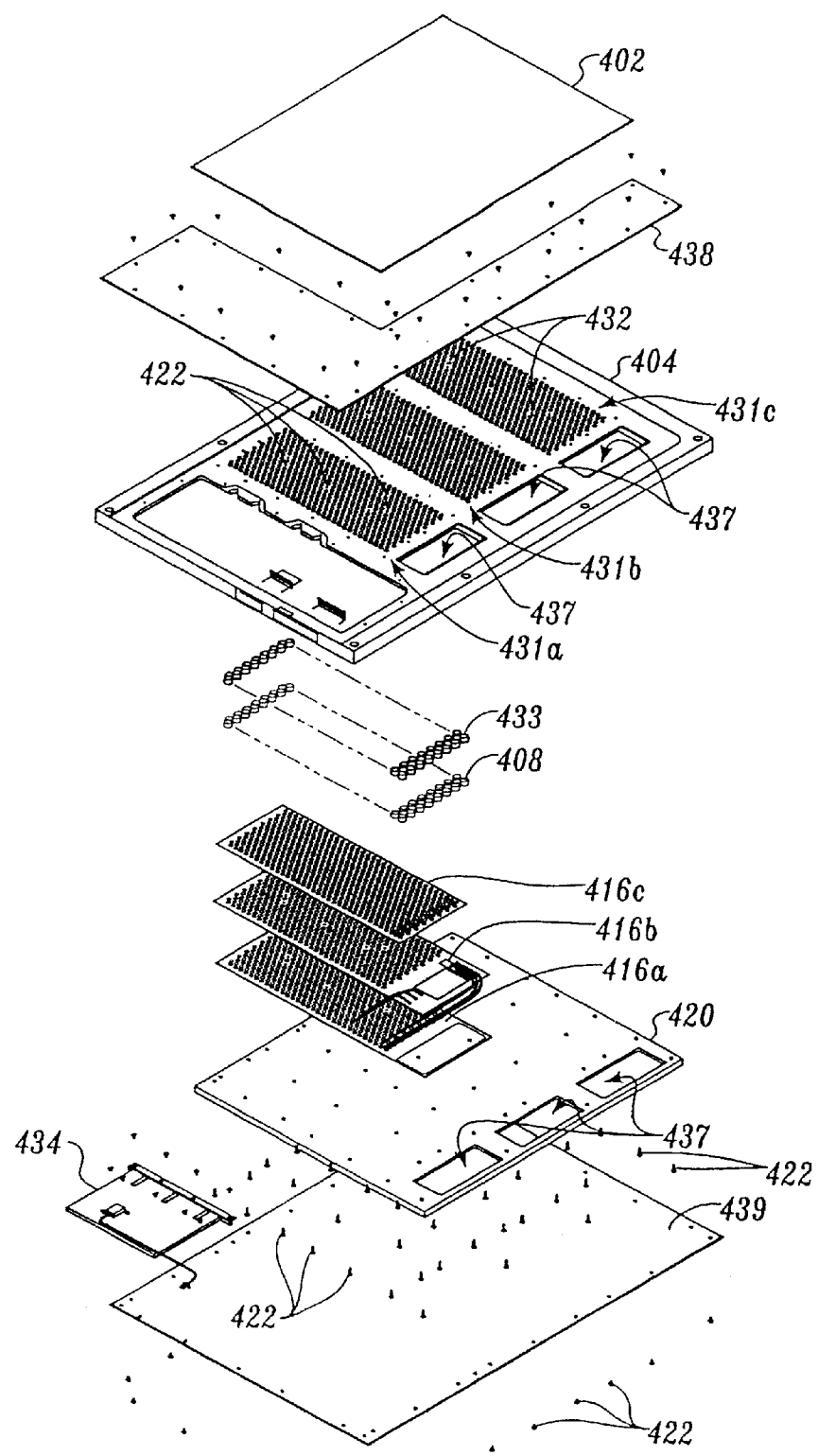
FIG. 2 is an exploded top perspective of an electronically switchable single polarity phased-array antenna.
Figure 2A:
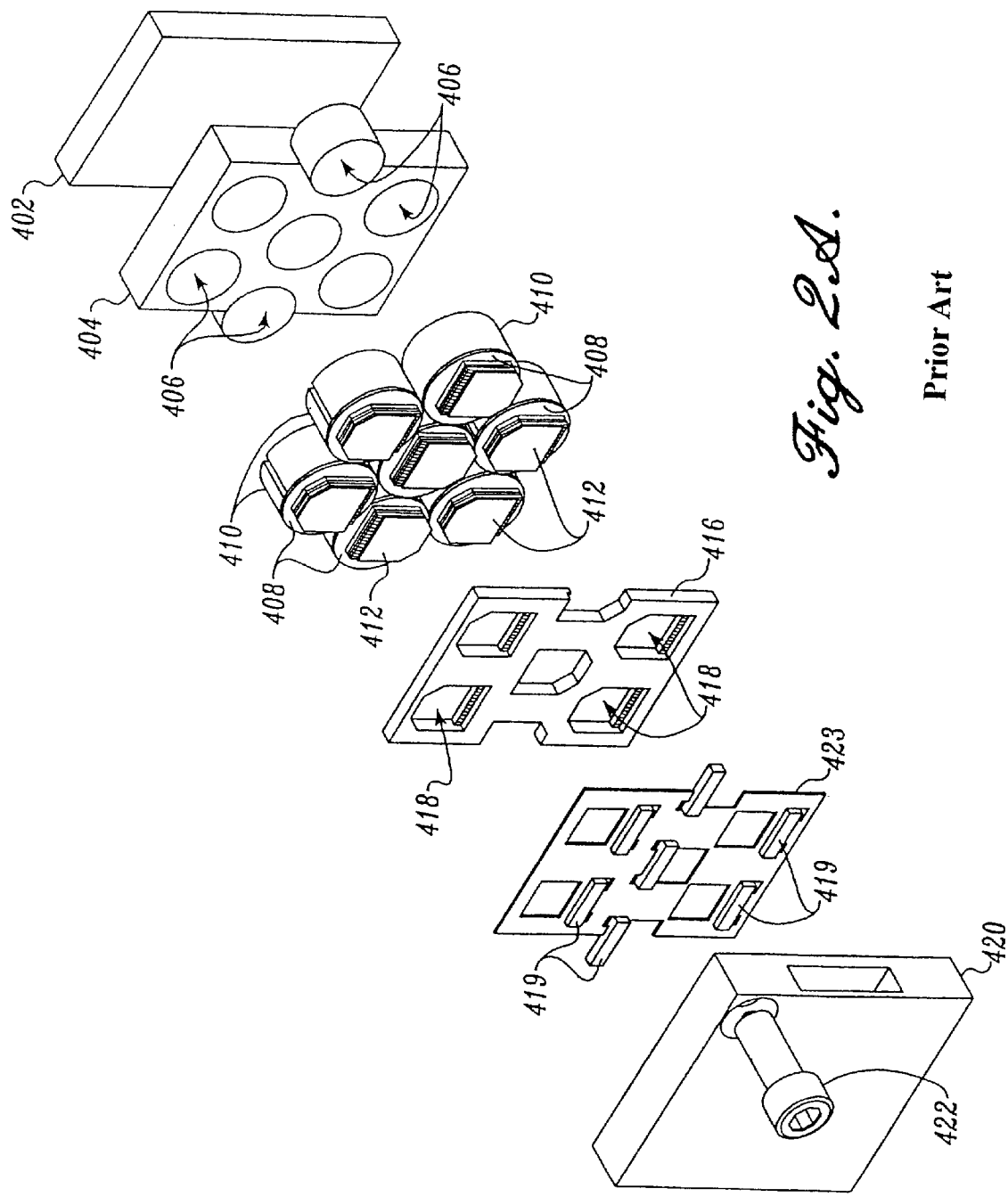
FIG. 2B & 2C shows a breakout of the module for each element of the electronically switchable single polarity phased-array antenna.
Figure 2B:
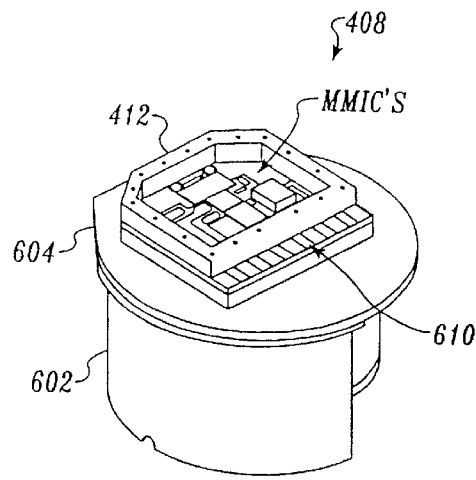
Figure 2C:
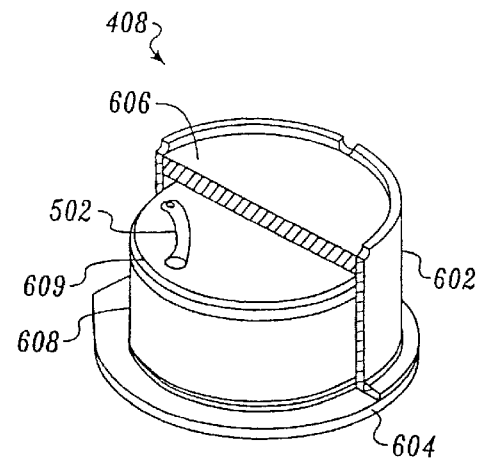
Figure 3:
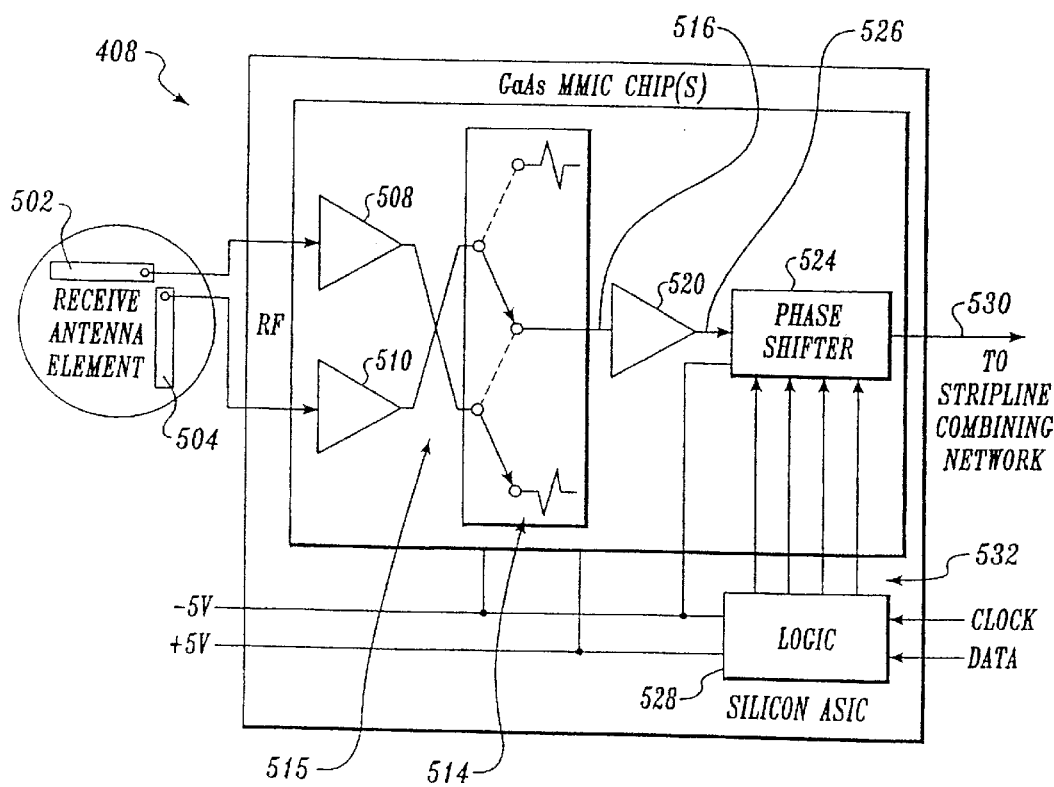
FIG. 3 is a block diagram for the electronic components of the electronically switchable single polarity phased-array antenna.
Figure 4:
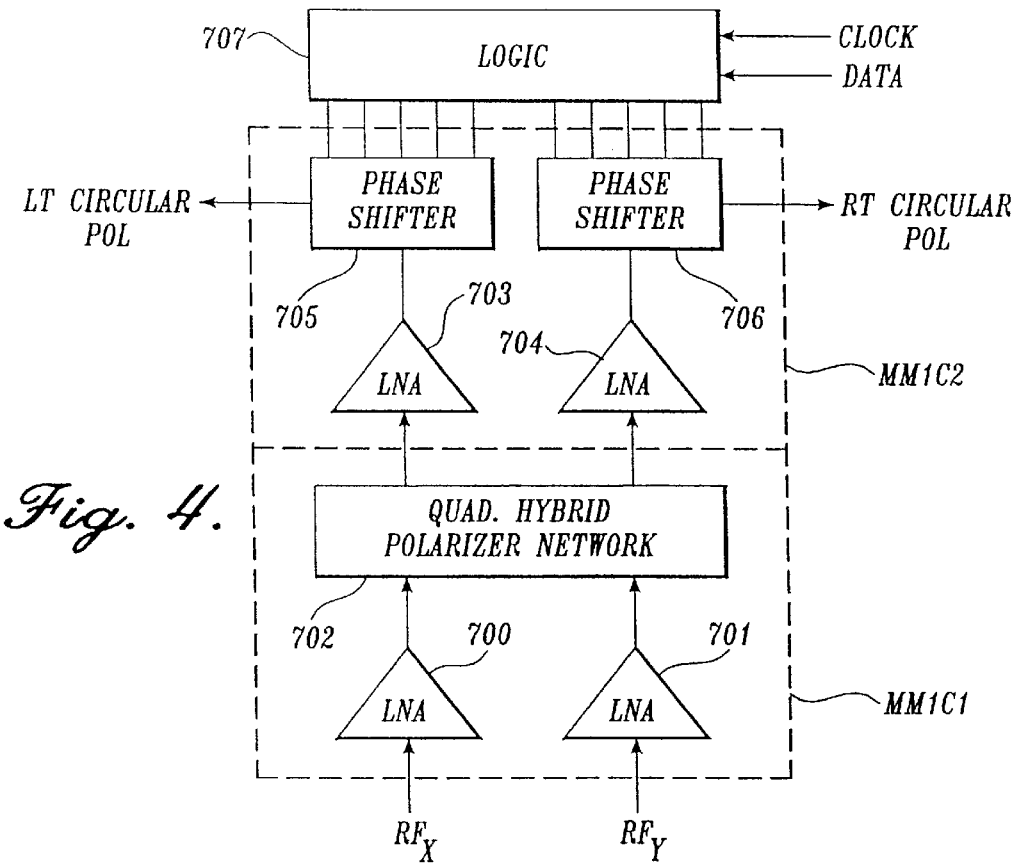
FIG. 4 is a block diagram for the electronic components of the electronically switchable single polarity phased-array antenna.

The microwave integrated circuitry that is contained by each module of a phased-array, such as is shown by reference numerals 408 in FIGS. 2, 2A–C, and 3, is the subject of the present invention. In particular, the present invention is directed towards a MMIC circuit architecture that is compact, low cost to implement, does not require external components to provide DC power supply filtering or bias control for the MMIC amplifier or require differential dive circuitry for control of the digital phase shifter. The circuitry of this invention when provided with the orthogonal waveguide probes 502 and 504 and configured as in FIG. 3, is capable of receiving either polarization signal and can electronically switch between the their polarity of the dual polarization signal being transmitted. The circuitry in this invention when configured as in FIG. 4 is capable of receiving both polarities of signal simultaneously and can steer to the signals on two separate beams at the same time. FIGS. 5–10 describe the two amplifier MMIC architectures identified as MMIC 1. FIG. 11 shows a variable phase, phase shifter identified by reference numeral 524 in FIG. 3.

Figure 5:
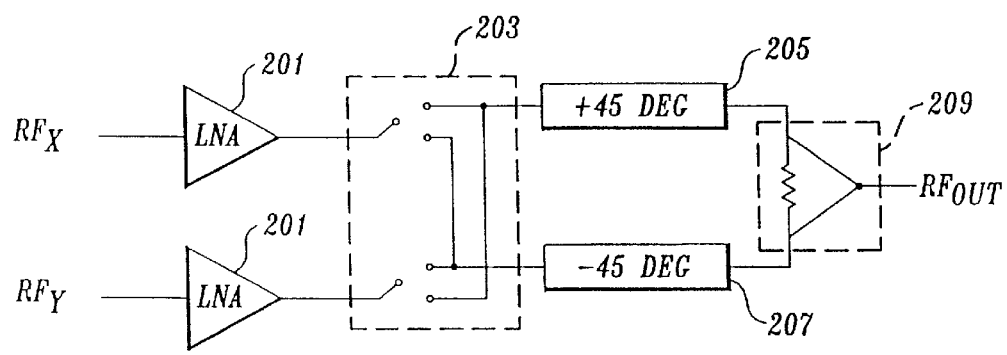
FIG. 5 is a block diagram of a x–y probe input, switchable single polarization output circuit.

FIG. 5 shows a functional block diagram of an amplifier MMIC suitable for use in receiving either left-hand circularly polarized signals or right-hand circularly polarized signals. The two inputs RFx and RFy are connected to antenna probes that are placed orthogonal to each other within each of the waveguides. Two low noise amplifiers 201, one for each input RFx and RFy, are provided to amplify the input signals. A double pole, double throw switch 203 is provided to route the signals from the low noise amplifiers 201 straight through to phase shifter networks 205 and 207 or to cross over the amplifier outputs to the inputs of the phase shift networks. First phase shift network 205 generates a +45° phase shift and second phase shift network 207 generates a −45° phase shift.

Figure 7:
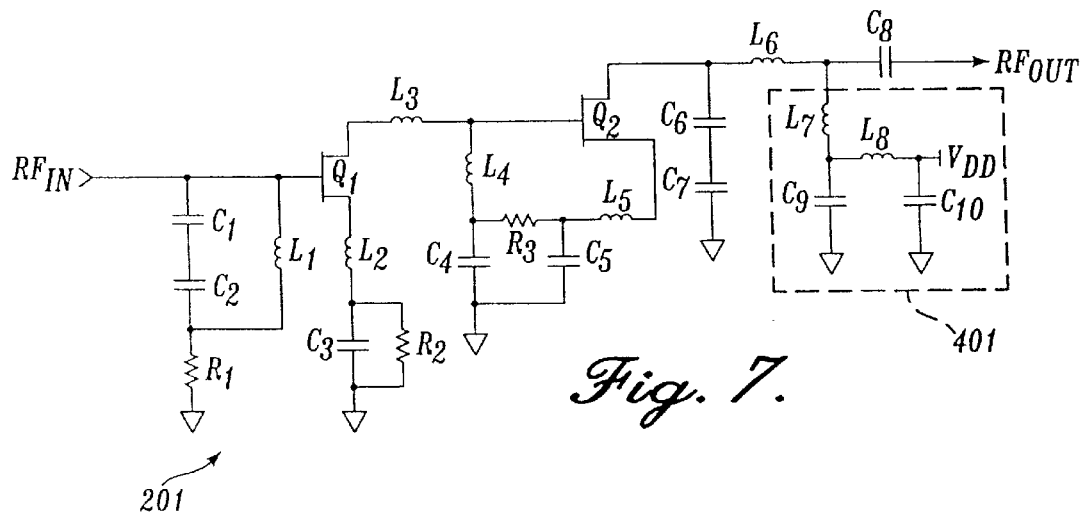
FIG. 7 is a schematic diagram of a low noise amplifier formed in accordance with the present invention.

Finally, the output of the phase shift networks 205 and 207 are connected to a power combiner 209 that combines the two inputs into a single output signal, RFout. The power combiner 209 coherently combines the two input signals. The preferred embodiment of the combiner 209 is shown in FIG. 7 (further described below). It can be appreciated that input signals from orthogonal antenna probes that are shifted in phase by +90 degrees or −90 degrees and coherently combined will provide either a left-hand polarized signal or a right-hand polarized signal, while rejecting the opposite polarity signal.

The architecture shown in FIG. 5 provides for two modes of operation. The first mode is with the double pole, double throw switch 203 placed into the "straight through mode." The two input signals from the low noise amplifier 201 are amplified and then shifted in phase such that the phase difference between the signal RFx and RFy is +90°. The second mode of operation is with the double pole, double throw switch 203 being configured so that the input RFx is provided to the second phase shift network 207 and the input from RFy is provided to first phase shift network 205. The resultant phase difference between the signal RFx and RFy is −90° for this switch setting. It can be appreciated by those skilled in the art that by selecting the switch position for the double pole, double throw switch 203, either left-hand polarized or right-hand polarized signals will be output by the RF combiner 209.

Figure 6:
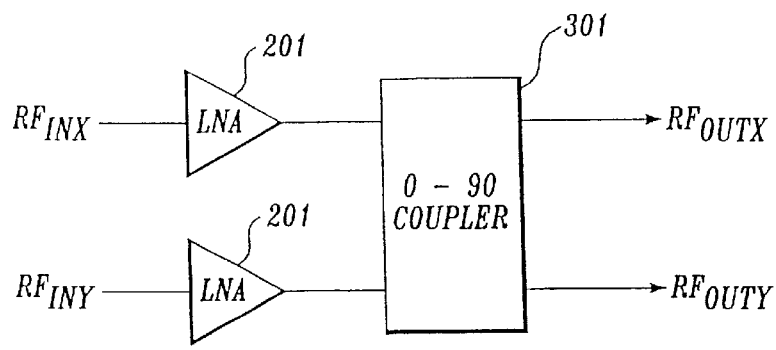
FIG. 6 is a block diagram of an x–y probe input, double polarization output circuit.

FIG. 6 shows an alternative embodiment of the present invention which allows both left-hand polarization and right-hand polarization signals to be simultaneously received and output. The signals from the low noise amplifiers 201 are provided to four port quadrate coupler 301. Preferably, the coupler 301 is a Lange coupler, which is well known in the art. See Lange, "Integrated Stripline Quadrature Hybrids", IEEE Transactions on Microwave Theory and Techniques, Dec. 1969. The Lange coupler is a type of 0–90° coupler with four ports: two input ports and two output ports. In operation, the Lange coupler will provide a right-hand circularly polarized signal at one of the output ports and a left-hand circularly polarized signal at the outer output port.

FIG. 7 shows a detailed schematic diagram of the low noise amplifier 201. As can be seen in FIG. 7, the low noise amplifier 201 is a two-stage amplifier with a power filter section 401. The power filter section 401 is a series L, shunt C bypass network that provides broadband bias line isolation. The power filter section consists of elements C10, L8, C9, and L7. Further, the design of the low noise amplifier requires no external components for bias. This eliminates the need for a −5 volt gate supply and off-chip bias components that would necessitate adjustment of bias control components in manufacturing and take up valuable module space. In the low noise amplifier 201, the bias is set by resistors R2 and R3. The design of the bias circuitry is such that resistors R2 & R3 provide negative feedback which desensitizes the bias current to MMIC Field Effect Transistor (FET) process variations. Another feature of the low noise amplifier 201 is source feedback through inductors L2 and L5. This helps to produce simultaneous noise and impedance match and desensitizes the MMIC performance to process variations.

Yet another feature is the series DC bias of the two amplification stages. This allows reuse of bias current, which lowers the DC power consumption. The DC current flows from the source of Q2 through L5, R3, L4, and L3 to the drain of Q1. Note also that lumped components are used for the bias and matching elements. This allows for compact chip size.

In addition, inductors L1, L2, and L5 are custom low-loss inductors, which facilitate a low noise figure for the amplifier. The FETs Q1 and Q2 are sized from low DC power dissipation, which allows the amplifier 201 to run cooler and thus have a lower noise figure. The layout of the amplifier is highly compacted. Additionally, the amplifier 201 has unconditional stability and is design optimized for both noise and impedance match, all of which is required, to avoid oscillation, have low noise figure and have sufficient cross pole rejection.

Figure 7A:
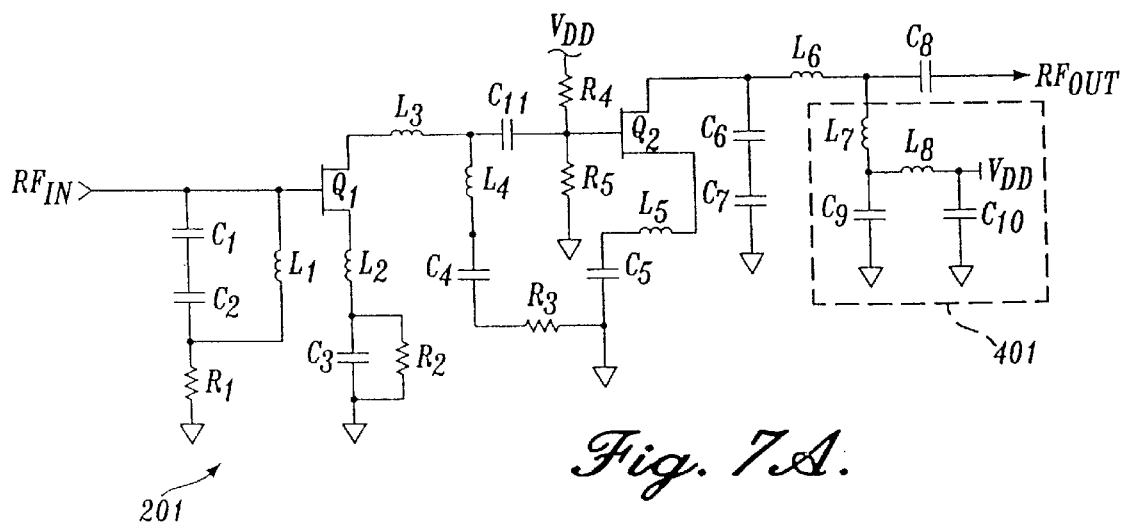
FIG. 7A is a schematic diagram of an alternate design of the low noise amplifier formed in accordance with the present invention.
Figure 7B:
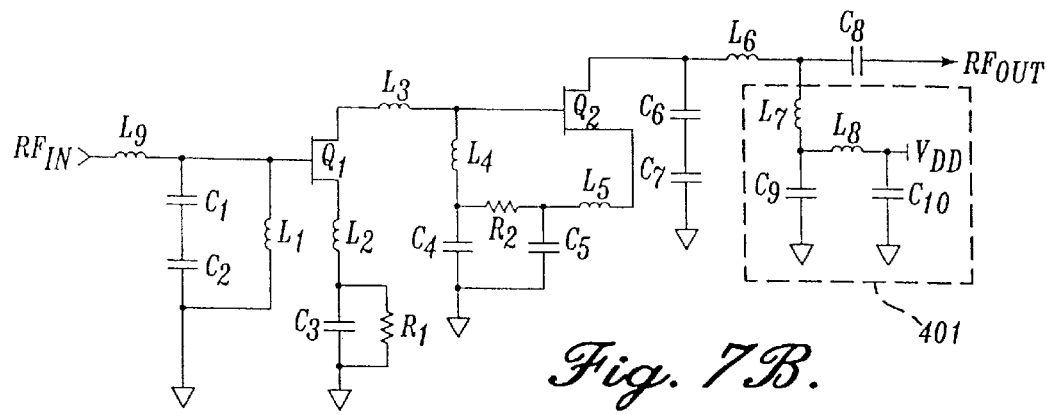
FIG. 7B is a schematic diagram of another alternate design of the low noise amplifier formed in accordance with the present invention.
Figure 7C:
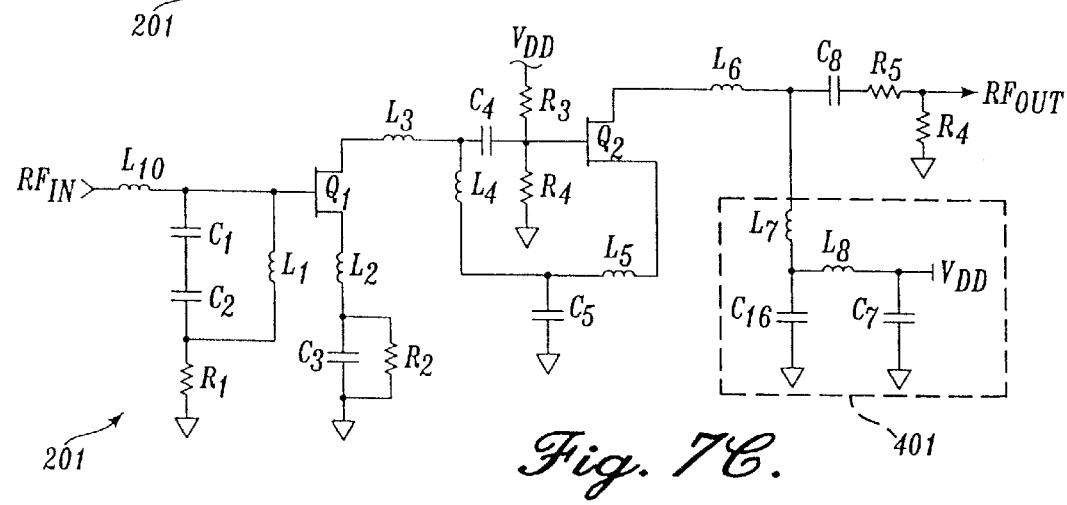
FIG. 7C is a schematic diagram of yet another alternate design of the low noise amplifier formed in accordance with the present invention.

The resulting low noise amplifier 201, 508, 510, 700 and 701 shown in FIGS. 7 and 7A, provides an approximate gain of 15 dB and a noise figure of 1.3 dB with proper off-chip impedance matching to the antenna element probes. The resulting low noise amplifier 520, 702, 703 shown in FIGS. 7B and 7C provides an approximate gain of 15 dB and a 50 ohm noise figure of 1.6 dB.

In the preferred embodiment, the elements of FIG. 7 have the following values: C1=0.047 pF, C2=0.047 pF, C3=6.5 pF, C4=0.7 pF, C5=7.6 pF, C6=0.091 pF, C7=0.091 pF, C8=3 pF, C9=4.5 pF, C10=4.5 pF, L1=2.5 nH, L2=0.41 nH, L3=0.82 nH, L4=1.17 nH, L5=0.23 nH, L6=0.76 nH, L7=4.5 nH, L8=4.5 nH, R1=7.3 ohms, R2=94.6 ohms, and R3=92.4 ohms.

The amplifier shown in FIG. 7A is functionally equivalent to the amplifier shown in FIG. 7 but will operate at a lower power supply voltage and thus save power when used in the phased-array. It achieves this by eliminating the use of R3 as a bias set resistor. The bias set by R2 controls the current in Q1 and also Q2, since the two transistors are in series for DC biasing.

In the preferred embodiment, the elements of FIG. 7A have the following values: C1=0.047 pF, C2=0.047 pF, C3=6.5 pF, C4=5.0 pF, C5=1.56 pF, C6=0.091 pF, C7=0.091 pF, C8=3 pF, C9=4.5 pF, C10=4.5 pF, C11=1.28 pF, L1=2.5 nH, L2=2.5 nH, L2=0.41 nH, L3=1.06 nH, L4=0.81 nH, L5=0.27 nH, L6=0.76 nH, L7=4.5 nH, L8=4.5 nH, R1=7.3 ohms, R2=94.6 ohms, and R3=30.0 ohms, R4=1000 and R5=7000 ohms.

The amplifier shown in FIG. 7B is functionally equivalent to the amplifier shown in FIG. 7 but has its input matched to 50 ohms rather than the probe impedance as the one in FIG. 7 does and is used as the second stage amplifier in the phased-array element module.

In the preferred embodiment, the elements of FIG. 7B have the following values: C1=0.047 pF, C2=0.047 pF, C3=6.5 pF, C4=3.0 pF, C5=7.5 pF, C6=0.087 pF, C7=0.087 pF, C8=3 pF, C9=4.5 pF, C10=4.5 pF, L1=2.5 nH, L2=0.38 nH, L3=1.16 nH, L4=1.0 nH, L5=0.25 nH, L6=0.90 nH, L7=3.8 nH, L8=5.0 nH, L9=0.7 nH, R1=110 ohms, R2=103 ohms.

The amplifier shown in FIG. 7C is functionally equivalent to the amplifier shown in FIG. 7 but has its input matched to 50 ohms rather than the probe impedance as the one in FIG. 7 does. It will operate at a lower power supply voltage and thus save power when used in the phased-array. It achieves this by eliminating the use of R3 as a bias set resistor. The bias set by R2 controls the current in Q1 and also Q2, since the two transistors are in series for DC biasing. This amplifier also has the values of C4 and C5 reduced which makes it more stable at lower frequencies since its gain is drastically rolled off below band, when compared to the 7–7B amplifiers. It can also used as the second stage amplifier in the phased-array element module.

In the preferred embodiment, the elements of FIG. 7C have the following values: C1=0.047 pF, C2=0.047 pF, C3=6.5 pF, C4=0.3 pF, C5=0.3 pF, C6=4.5 pF, C7=4.5 pF, C8=2.0 pF, L1=2.0 nH, L2=0.38 nH, L3=1.16 nH, L4=0.90 nH, L5=0.25 nH, L6=2.1 nH, L7=3.8 nH, L8=5.0 nH, R1=8.25 ohms, R2=110 ohms, and R3=1000 ohms, R4=7000 and R5=22 ohms and R6=220 ohms.

Figure 8:
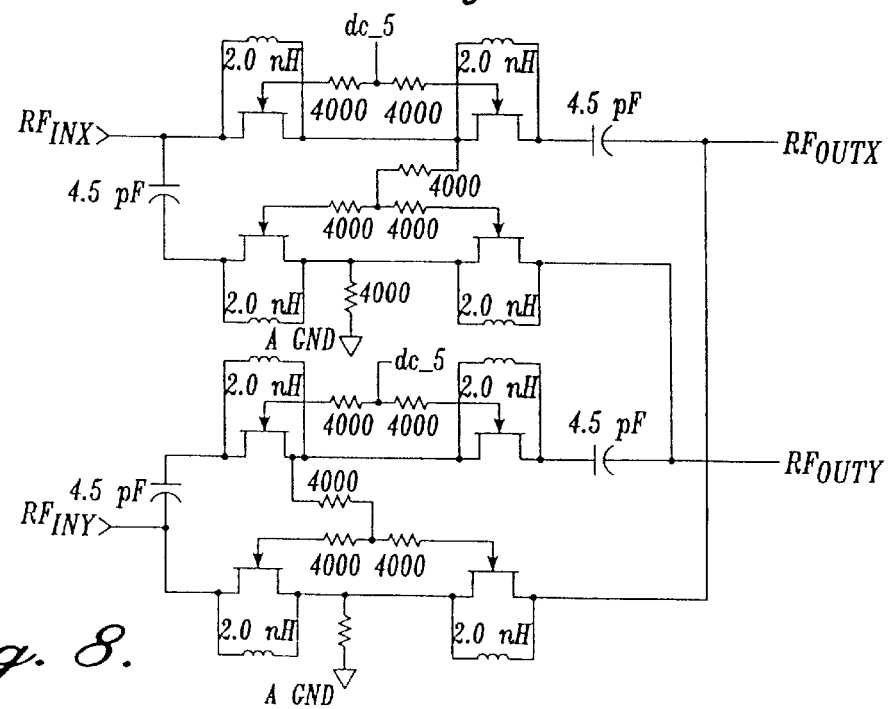
FIG. 8 is a schematic diagram of a double-pole, double-throw switch formed in accordance with the present invention.

Next, FIG. 8 illustrates a preferred schematic diagram of the double pole, double throw switch 203. The double pole, double throw switch 203 is a parallel combination of four single pole, double throw switches. Each single pole, single throw switch consists of two FET's connected in series. The drain-source of each FET is resonated with an inductor to cancel the drain-source capacitance of the FET. Each single pole, single throw switch has a 1.5 dB insertion loss in the "on state" and greater than 30 dB isolation in the "off state." The paralleling and cross connection of the four single pole, single throw switches increases the insertion lost to 2 dB and reduces the isolation of 25 dB. As can be seen, the FET switching is controlled by a −5 volt supply and a single control line that toggles between 0 and −5 volts.

Figure 9B:
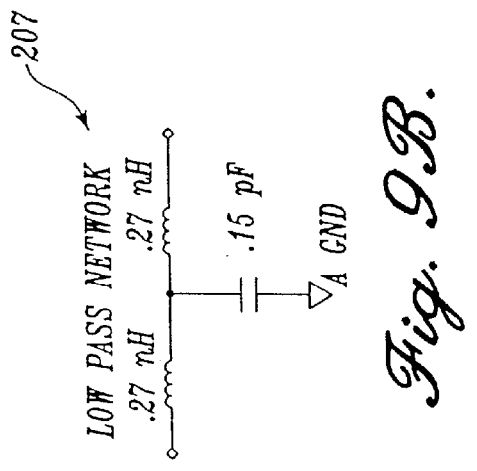
FIG. 9A is a schematic diagram of a high pass network for implementing a 45 degree phase shift.
Figure 9A:
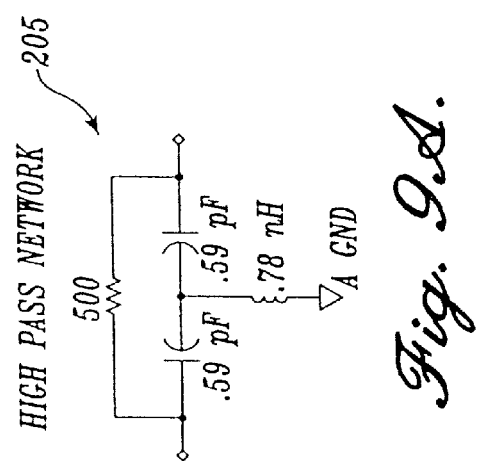

Turning next to FIG. 9A, a high pass network that is used to implement the first phase shift network 205 is shown. This network provides +45° phase shift. The high pass network is a series C, shunt L, series C arrangement. Similarly, in FIG. 9B, a low pass network used to implement the second phase shift network 207 is provided. This network provides −45° phase shift. This is a series L, shunt C, series L network. In the preferred embodiment, the high pass network 205 of FIG. 9A has capacitor components of 0.5 picofarads, an inductor value of 0.78 nanohenrys, and a resistor of 500 ohms. Similarly, in the preferred embodiment of the low pass network shown in FIG. 9B, it is preferred that the inductors have values of 0.27 nanohenrys and the capacitor has a value of 0.15 picofarads.

Figure 10:
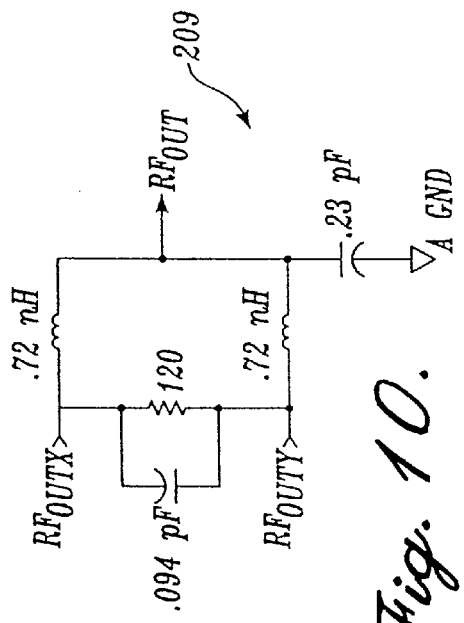
FIG. 10 is a schematic diagram of a power combiner formed in accordance with the present invention.
Figure 11:
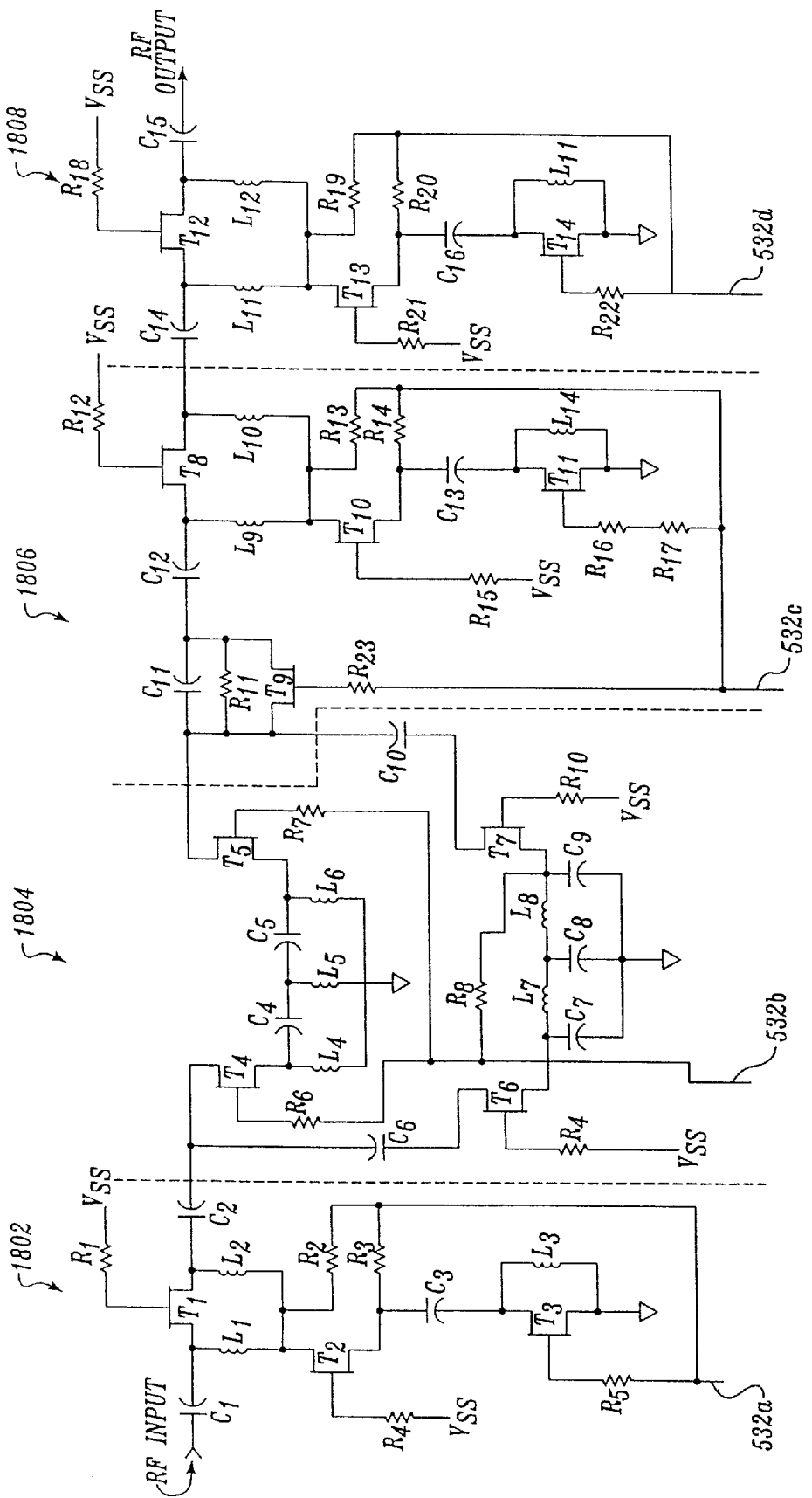
FIG. 11 is a schematic diagram of a phase shifter formed in accordance with the present invention.

Next, turning to FIG 10, the combiner 209 is shown. The combiner is a lumped component Wilkinson combiner that is compact enough to fit on the MMIC die. The preferred embodiment includes the addition of a shunt capacitor and a modified isolation resistor. In the preferred embodiment, the inductors have values of 0.72 nanohenrys, the resistor has a value of 120 ohms, the capacitor to ground has a value of 0.23 picofarads, and the shunt capacitor has a value of 0.094 picofarads.

Turning next to FIG. 11, a schematic illustration of a phase shifter formed in accordance with the present invention is provided. The phase shifter is a custom designed lumped-element phase shifter implemented on a single GaAs MMIC. The phase shifter provides a phase shift in 22.5° increments in response to a 4-bit digital signal from a logic circuit. Initially, the phase shifter of the present invention is distinguished from the prior art (exemplified by the model RMM3020 phase shifter available from Raytheon) in one primary aspect. The present phase shifter operates with only a single control voltage line per phase shifter stage. Prior art lumped component MMIC phase shifters require two control voltage lines for each phase shifter stage. Which necessitates the routing of additional control lines to bond-pads to be wire bonded to, or as done in the RR3020, placing driver circuitry on the MMIC to convert the single ended control lines to differential lines. The phase shifter design disclosed in this patent, allows the stages of the phase shifter to be significantly smaller than the prior art. Those of ordinary skill in the art will recognize that on-chip drivers and/or additional control lines and bondpads require substantial amounts of chip space. Therefore, by providing a phase shifter with only a single control line and driver per stage, the phase shifter can be made smaller and less expensively.

Looking at FIG. 11 in detail, phase shifter includes four stages, 1802, 1804, 1806, and 1808. The first stage 1802 is operative to provide a 22.50 phase shift. The second stage 1804 is operative to provide a 180° phase shift. The third stage 1806 is operative to provide a 90° phase shift. The fourth stage 1808 is operative to provide a 22.5° or 45° phase shift. By activating or deactivating these phase shift stages, it can be appreciated that an input RF signal can be shifted in phase up to 337.5 in 22.5 increments. The phase shift is also referred to as a four-bit phase shifter because of the use of four single bit control lines.

Control lines 532a–d are used to activate the phase shift stages. As seen, first control line 532a is used to control first stage 1802, second control line 532b is used to control second stage 1804, third control line 532c is used to control third stage 1806, and fourth control line 532d is used to control fourth stage 1808.

The second stage 1804 consists of a lumped component fifth order high pass filter and a fifth order low pass filter connected with a series FET single-pole, double-throw (SPDT) switch which selects either the high pass or low pass path. The low pass path of the SPDT switch is DC offset by −5 volts to allow a single 0 volt or −5 volt control line to be used to select either the high or low pass filter. The other stages 1802, 1806, and 1808 consist of modified third order "T" section high-pass/low-pass filters where the FET switches are incorporated into the filter structures. Sections of the filter are DC isolated and offset to allow controlled by the DC voltage applied to a single bond pad per stage.

The first stage 1802 and the fourth stage 1808 are identical in topology.

In the preferred embodiment, the values for the element of first stage 1802 are as follows: C1=2.37 picofarads, C2=4.5 picofarads, C3=4.5 picofarads, R1=5.15 kilo ohms, R2=5 kilo ohms, R3=5 kilo ohms, R4=5 kilo ohms, R5=5 kilo ohms, L1=0.22 nanohenrys, and L2=0.22 nanohenrys. For the fourth stage 1808, the preferred values of the elements to form a 45° phase shifter are as follows: C14=3.0 picofarads, C15=0.65 picofarads, C16=4.5 picofarads, R18=5 kilo ohms, R19=5 kilo ohms, R20=5 kilo ohms, R21=5 kilo ohms, R22=5 kilo ohms, L11=0.18 nanohenrys, L12=0.18 nanohenrys, and L13=0.692 nanohenrys. The first stage 1802 also includes three transistors T1, T2, and T3. These transistors are depletion mode transistors (as are all of the other transistors of the phase shifter), so that when the gate of the transistor and the source of the transistor are at equal voltages, the transistor is "on." As seen in FIG. 18, the gates of T1 and T2 are tied through resistors R1 and R4 to a voltage Vss. For the preferred embodiment, Vss is equal to −5.0 volts DC. Also, the sources of transistors T1 and T2 are tied to the control line 532a. Because the sources of transistors T1 and T2 and the gate of T3 are tied to the control line 532a through large valued series resistors and inductors, which provide a DC path for the voltage applied to the control line 532a, the microwave path in the switch is isolated from the DC control circuitry.

Control line 532a, and indeed control lines 532b, through 532d, are input with a signal of either 0 volts or −5.0 volts DC. In this case, 0 volts is considered "high" and −5 volts is considered "low." When the control line 532a is set to −5 volts, transistors T1 and T2 are on while transistor T3 is off. The resulting arrangement allows the RF input to travel through the high-pass filter section of the first stage 1802. This action causes the phase of the RF signal to be advanced. In contrast, if the control line 532a is set at 0 volts (or "high"), then transistor T1 is off, transistor T2 is off, and transistor T3 is on. The resulting circuit is a third order low-pass filter which causes the RF signal to be delayed. The desired phase shift, for the bit, is the difference of the phase shift of the high-pass state subtracted from the phase shift of the low-pass state. For example, the low pass state gives −11 degree phase shift and the high pass state gives a 11 degree phase shift. The differential phase shift would be −22 degrees. The transistors off-state parasitic capacitance is incorporated into the high-pass and low-pass filters sections. The operation of the fourth stage 1808 is identical to that of the first stage 1802.

Similarly, the third stage 1806 is substantially similar to the first and fourth stages 1802 and 1808, except that an additional section comprised of transistor T9, resistor R11 and capacitor C11 is included. The gate of transistor T9 is connected through resistor R11 and capacitor C11 is included. The gate of transistor T9 is connected through resistor R23 to the control line 532c. Transistor T9 and capacitor C11 are used to improve the input impedance match of the third stage 1806. When the filter is in the high-pass state, the reactance of C11 is connected in series with the filter. Likewise, when the filter is in the low-pass state, the reactance of C11 is shorted out by transistor T9. In the preferred embodiment, the values of the elements of the third stage 1806 are as follows: C11=0.477 picofarads, C12=4.5 picofarads, C13=4.5 picofarads, R11=5 kilo ohms, R12=5.15 kilo ohms, R23=5 kilo ohms, R13=5 kilo ohms, R14=5 kilo ohms, R15=5 kilo ohms, R16=2.5 kilo ohms, R17=2.5 kilo ohms, L9=0.33 nanohenrys, L10=0.224 nanohenrys, and L14=0.381 nanohenrys.

As noted above, the second stage 1804 is made up of a lumped-component high pass and low pass phase shift networks embedded between with two single pole double throw (SPDT) switches. *INS B1* the structure formed by elements C4, C5, L4, L5, and L6 form a fifth order high pass filter. Similarly, the structure formed by inductors L7, L8, and capacitors C7, C8, and C9 form a fifth order low pass filter. The transistors T4, T5, T6, and T7 are controllable to allow the signal to pass either through the low pass section or the high pass section of the stage 1804. For example, if the control line 532b is at 0 volts, transistors T4 and T5 will be on and the signal will pass through the high pass filter formed by capacitors C4–C5 and L4–L6. However, if the control line 532b is at −5 volts, then transistors T6 and T7 will be on while transistors T4 and T5 will be off. This causes the signal to travel through the low pass section formed by inductors L7–L8 and C7–C9.

When the RF signal travels through the low-pass filter section, it is delayed in phase. Likewise, when it travels through the high-pass filter sections it is advanced in phase. The desired phase shift, for the bit, is the difference of the phase shift of the high-pass state subtracted from the phase shift of the low-pass state. For example, the low pass state gives −90 degree phase shift and high pass state gives a 90 degree phase shift. The differential phase shift would be −180 degrees.

IN the preferred embodiment, the values of the elements of the second stage 1804 are as follows: C4=0.555 picofarads, C5=0.555 picofarads, C6=4.5 picofarads, C7=0.131 picofarads, C8=0.026 picofarads, C9=0.131 picofarads, C10=4.5 picofarads, L4=0.925 nanohenrys, L5=1.356 nanohenrys, L6=0.925 nanohenrys, L7=0.405 nanohenrys, L8=0.405 nanohenrys, R6=5 kilo ohms, R7=5 kilo ohms, R8=5 kilo ohms, R9=5 kilo ohms, and R10=5 kilo ohms.

As can be seen from the design of all of the stages, the filter sections are DC isolated allowing the necessary stages to be "floated" to a voltage VSS. As can be appreciated by those skilled in the art, this design allows the phase shifter stages to be controlled by a single control line.

While the preferred embodiment of the invention has been illustrated and described, it will be appreciated that various changes can be made therein without departing from the spirit and scope of the invention.

The embodiments of the invention described above are illustrative of the principles of the invention and are not intended to limit the invention to the particular embodiments described. For example, in other embodiments, other types of connectors can be used instead of the elastomeric and fuzz button connectors described. Other embodiments may use striplines in the True Time Delay (TDD) instead of microstrips. Further, in other embodiments, the phased-array antenna may be used in applications other than DBS applications, or in applications using Electro Magnetic (EM) signals that are not circularly polarized or linearly polarized. Accordingly, while the preferred embodiment of the invention has been illustrated and described, it will be appreciated that various changes can be made therein without departing from the spirit and scope of the invention.

What is claimed is:

1. A four stage selectable phase shifter for use in a phased array antenna, the phase shifter selectably causing an input signal to be shifted in phase, said phase shifter comprising:

a first stage for selectively providing a 22.5 degree phase shift, said first stage providing said 22.5 degree phase shift in response to a first control signal;

a second stage for selectively providing a 180 degree phase shift, said second stage providing said 180 degree phase shift in response to a second control signal;

a third stage for selectively providing a 90 degree phase shift, said third stage providing said 90 degree phase shift in response to a third control signal;

a fourth stage for selectively providing a second 22.5 degree phase shift, said fourth stage providing said 22.5 degree phase shift in response to a fourth control signal, wherein each of said stages are floated to a common voltage Vss.

2. The phase shifter of claim 1 wherein said second stage is a fifth order high and low pass filter with a series FET single-pole, double-throw switch that is controlled by said second control signal.

3. The phase shifter of claim 1 wherein said first and fourth stages are modified third order T section high-pass/low-pass filters.

4. The phase shifter of claim 1 wherein said third stage is a modified third order T section high-pass/low-pass filter further comprising a transistor/resistor/capacitor section.

\* \* \* \* \*